(12) United States Patent
Goebel et al.

(10) Patent No.: US 6,716,714 B1
(45) Date of Patent: Apr. 6, 2004

(54) SEMICONDUCTOR DIODE AND METHOD FOR PRODUCING THE SAME

(75) Inventors: Herbert Goebel, Reutlingen (DE); Vesna Goebel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/049,474

(22) PCT Filed: Jul. 8, 2000

(86) PCT No.: PCT/DE00/02235
§ 371 (c)(1),
(2), (4) Date: Jul. 18, 2002

(87) PCT Pub. No.: WO01/13434
PCT Pub. Date: Feb. 22, 2001

(30) Foreign Application Priority Data

Aug. 12, 1999 (DE) .......................................... 199 38 209

(51) Int. Cl.⁷ ........................ H01L 21/20; H01L 21/301
(52) U.S. Cl. ........................ 438/380; 438/462; 438/549; 257/594; 257/603
(58) Field of Search .......................... 438/91, 380, 465, 438/462, 549, 983; 257/594, 603, 605

(56) References Cited

U.S. PATENT DOCUMENTS

| | | | | |
|---|---|---|---|---|
| 5,541,140 A | * | 7/1996 | Goebel et al. | 257/603 |
| 5,766,973 A | * | 6/1998 | Goebel et al. | 257/594 |
| 2002/0125541 A1 | * | 9/2002 | Korec et al. | 257/471 |

FOREIGN PATENT DOCUMENTS

| | | |
|---|---|---|
| DE | 43 20 780 | 3/1995 |
| DE | 198 57 243 | 7/1999 |

* cited by examiner

*Primary Examiner*—Minh-Loan Tran
(74) *Attorney, Agent, or Firm*—Kenyon & Kenyon

(57) ABSTRACT

A semiconductor arrangement and a method for manufacturing the semiconductor arrangement are provided, which arrangement and method allow an improvement in the current-carrying capacity for given chip dimensions. The semiconductor arrangement includes trenches introduced in the interior of the chip, which trenches reduce power loss and improve the heat dissipation of the chip, as well as reduce the forward voltage of diode.

3 Claims, 2 Drawing Sheets

SEMICONDUCTOR DIODE AND METHOD FOR PRODUCING THE SAME

FIELD OF THE INVENTION

The present invention relates to a semiconductor arrangement and a method for manufacturing the semiconductor arrangement.

BACKGROUND OF THE INVENTION

German Patent document No. P 4320780.4 describes a semiconductor diode having a first layer made of two partial layers, and a second layer which is situated on the first partial layer.

SUMMARY OF THE INVENTION

The present invention's semiconductor arrangement and method for manufacturing the semiconductor arrangement has the advantage of providing diodes having an increased maximum permissible power and less forward voltage for a given chip surface, in a manner suitable for large-scale mass production, without a large amount of additional engineering expense. This is particularly advantageous when a maximum preselected chip surface area should not be exceeded in order to save chip surface, and when the size of the contact socket used to contact the semiconductor arrangement should not exceed a certain magnitude, in order to avoid paying for an increased current-carrying capacity of diodes particularly used in a motor-vehicle rectifier system, with an increased volume of the entire rectifier system. The present invention facilitates, given a constant surface area of the silicon

DETAILED DESCRIPTION

FIG. 1a shows a cross-sectional side view of a semiconductor chip 7, which is in the form of a diode. Chip 7 has a first semiconductor layer which is made of a first partial layer 2, a second partial layer 3, and a third partial layer 4. The doping of n-doped partial layer 2 is on the order of $10^{18}$ cm$^{-3}$. Partial layer 3 is n-doped to a concentration of approximately $10^{14}$ cm$^{-3}$, and partial layer 4 is doped to an—concentration of approximately $10^{20}$ cm$^{-3}$. Two trenches 10 are introduced into partial layer 2, which trenches extend into partial layer 3. These trenches 10 are situated in inner region 13 of chip 7. Edge regions 12 of the chip have a bevel 11, which extends into partial layer 3 as do trenches 10. Deposited onto first partial layer 2, both into trenches 10 and in bevel 11, is a second layer 20, whose regions in trenches 10 and bevels 11 are designated as continuation regions 23 and further continuation regions 24 of second layer 20, respectively. Second layer 20 is p-doped and has a doping on the order of $10^{20}$ cm$^{-3}$. The wafer topside, which is covered by layer 20, and the wafer bottom side, which is formed by layer 4, are provided with metallic coatings 22 and 21, respectively. FIG. 1b shows a plan view of the chip 7 shown in FIG. 1a. The top of chip 7 is covered by metallic coating 22. As a result of the trenches 10 that are introduced, this metallic coating 22 has a pattern characterized by corresponding depressions.

The p-n junction region of the diode is formed by p-doped layer 20 and n-doped layers 2 and 3 of FIG. 1a. As a result of the trenches 10 that are introduced, continuation regions 23 in interior 13 of chip 7 form a p-n junction with second partial layer 3. These regions lead to a reduction in the forward voltage of the diode, with metallic coating 22 being used as the anode and metallic coating 21 being used as the cathode. The four grooves in the interior of chip 7 (cf. FIG. 1b) allow the electrical load to be increased by over 12% in comparison with an identically constructed diode not having grooves in the interior. In other words, a diode that can withstand, for example, a 65 A load may be converted to a diode having a maximum load of 75 A. An 80 A diode becomes a 90 A diode. The forward voltage may be reduced by approximately 60 mV (measured at a 100 A load). The four additional grooves or trenches in the interior of chip 7 also result in the chip being soldered more effectively and free of bubbles, i.e. the socket and lead wire are attached to the diode chip in an improved manner. In addition, the grooves filled with solder during this soldering procedure (not shown in the figure) ensure that the chip cools in an improved manner, since the solder in the grooves, which then completely fills the grooves, thermally couples the chip in an intensive manner, to a metal base used as a heat sink.

FIG. 1b shows an exemplary embodiment of a chip 7, i.e., a square chip. However, not only are squares possible, but also other surfaces that are defined by straight edges (e.g. a hexagon or an octagon) and have additional, corresponding internal grooves parallel to the edges.

FIG. 2 shows a semiconductor wafer having a first partial layer 2, a second partial layer 3, and a third partial layer 4, which wafer is used in producing the semiconductor arrangement of the present invention. All three partial layers are n-doped. The starting point for manufacturing this sequence of layers is a weakly n-doped wafer, whose dopant concentration corresponds to the dopant concentration of partial layer 3. N-dopant, e.g. phosphorus, is then introduced onto and diffused into the topside and bottom side, using film diffusion. A layer, whose dopant concentration corresponds to partial layer 2, is consequently formed on the topside, and a layer, whose dopant concentration corresponds to partial layer 4, is formed on the bottom side. In this context, the dopant concentration of the layers is determined by the dopant concentration of the films.

The manufacture of such a layer sequence is already known from German Patent document No. P 4320780.4. As an alternative, this sequence of layers can also be manufactured using neutral is films, as is described in the German patent application No. 19857243.3.

FIG. 3 shows a further step of the manufacturing method for producing the semiconductor arrangement according to the present invention. In this context, trenches 10 are introduced into the semiconductor wafer, which subdivide partial layer 2 into subsections, trenches 10 extending through to partial layer 3. Trenches 10 can be introduced, for example, by sawing or etching. The spacing of trenches 10 is adjusted in such a manner that the wafer can subsequently be separated along the trenches, into individual chips; after the separation, each chip still has at least one trench 10 in its interior. However, the wafer surface is first cleaned prior to being processed further, in order to remove any remaining particles from the surface.

In comparison with the device and method described in German Patent document P 4320780.4, the spacing of the saw lines is halved during the sawing-in procedure (in order to obtain two additional grooves per chip) or reduced to one third (in order to obtain four additional grooves per chip). In the present case, the spacing of the grooves is typically 1–3 mm. No additional method step is necessary here, since, as is known from German Patent document P 4320780.4, the sawing-in procedure is executed to lay out the chip edge, anyway. One must only set the line spacing to be somewhat smaller during the sawing-in procedure. This does not considerably change the processing time of this sawing step, since the wafer handling, the alignment, and the cleaning with deionized water done in the automatic sawing device after the sawing-in procedure, are carried out anyway.

After the introduction of trenches 10, a p-dopant such as Boron is introduced into the topside. At the same time, the dopant concentration of bottom layer 4 may be increased if so desired. P-dopant is introduced again, using film diffusion. In this diffusion step, possible defects present in the silicon monocrystal in the immediate vicinity of trenches 10 are repaired. The p-diffusion converts the top layer of the silicon wafer into a p-conductive region. The thickness of this p-layer is approximately uniform over the length of the device, even in the trenches. In FIG. 4, the resulting p-conductive layer is represented by reference numeral 20. Subsequent to the deposition of layer 20 and the possible intensification of the doping of partial layer 4, the two sides of the wafer are metallized so that p-conductive layer 20 is provided with a metallic coating 22 and n-doped, third partial layer 4 is provided with a metallic coating 21. In a further step, the wafer is diced along separation lines 25, into a plurality of individual diodes, so that individual chips 7 are formed whose structure is described in FIGS. 1a and 1b. Prior to sawing the wafer along separation lines 25, the wafer side having metallic coating 21, i.e. the bottom side, is pasted to a sawing sheet so that the individual chips do not fly off in an uncontrolled manner or become damaged.

The width of the saw lines during the sawing-in procedure is approximately 40 to 150 $\mu$m, and the lengths of the chip edges are in the range of approximately 5 mm. The area of the additional saw grooves in the interior of the individual chips only makes up a few percent of the chip surface. Of course, the method of the present invention can also be used to manufacture diodes doped in an opposite manner, i.e. diodes where a p-doped wafer is used as a starting point, in place of an n-doped wafer.

What is claimed is:

1. A method for manufacturing a semiconductor chip, comprising the steps of:

providing a semiconductor wafer which includes a first layer having at least two partial layers, the first partial layer being disposed on the second partial layer, the two partial layers having a first conductivity type, the first partial layer having a first dopant concentration, the second partial layer having a second dopant concentration, and the second dopant concentration being less than the first dopant concentration;

introducing trenches into the first partial layer, which trenches extend through the first partial layer into the second partial layer;

introducing dopants of a second conductivity type into the top surface of the wafer to change the conductivity type of a section of the first partial layer and a section of the second partial layer, whereby a second layer is formed; and depositing metallic coatings on the top surface and the bottom surface of the wafer; and separating the wafer along the trenches into individual chips, such that each chip has at least one trench in its interior.

2. The method according to claim 1, further comprising the step of introducing the trenches by sawing.

3. The method according to claim 1, further comprising the step of introducing the trenches by etching.

* * * * *

UNITED STATES PATENT AND TRADEMARK OFFICE
CERTIFICATE OF CORRECTION

PATENT NO.    : 6,716,714 B1
DATED         : April 6, 2004
INVENTOR(S)   : Herbert Goebel et al.

It is certified that error appears in the above-identified patent and that said Letters Patent is hereby corrected as shown below:

<u>Title page,</u>
Item [57], ABSTRACT,
Line 8, change "voltage of diode." to -- voltage of the diode --

<u>Column 1,</u>
Line 33, change "the silicon" to   --the silicon chip, the allowable current load to be increased and the thermal loading of the silicon chip to be reduced in a manner that can be realized relatively simply. In so doing, a reduction in the forward voltage is simultaneously achieved. The effect of additional saw grooves is particularly advantageous, because later, when the socket and lead wire are soldered to the diode chip, the grooves lead to a better, bubble-free soldering procedure (capillary effect), and the grooves filled with solder result in additional, more effective cooling of the chip, which extends into the depth of the silicon body and therefore thermally couples the chip to the heat sink in a more effective manner.

BRIEF DESCRIPTION OF THE DRAWINGS, should read as follows:

Fig. 1b shows a plan view of the diode shown in Fig. 1a.

UNITED STATES PATENT AND TRADEMARK OFFICE
CERTIFICATE OF CORRECTION

PATENT NO. : 6,716,714 B1
DATED : April 6, 2004
INVENTOR(S) : Herbert Goebel et al.

It is certified that error appears in the above-identified patent and that said Letters Patent is hereby corrected as shown below:

Column 2,
Line 43, change "neutral is filing" to -- neutral filing --

Signed and Sealed this

Fifth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,716,714 B1
DATED : April 6, 2004
INVENTOR(S) : Herbert Goebel et al.

It is certified that error appears in the above-identified patent and that said Letters Patent is hereby corrected as shown below:

Title page,
Item [57], ABSTRACT,
Line 8, change "voltage of diode." to -- voltage of the diode --

Column 1,
Line 33, change "the silicon" to   --the silicon chip, the allowable current load to be increased and the thermal loading of the silicon chip to be reduced in a manner that can be realized relatively simply. In so doing, a reduction in the forward voltage is simultaneously achieved. The effect of additional saw grooves is particularly advantageous, because later, when the socket and lead wire are soldered to the diode chip, the grooves lead to a better, bubble-free soldering procedure (capillary effect), and the grooves filled with solder result in additional, more effective cooling of the chip, which extends into the depth of the silicon body and therefore thermally couples the chip to the heat sink in a more effective manner.

Figure 1A:
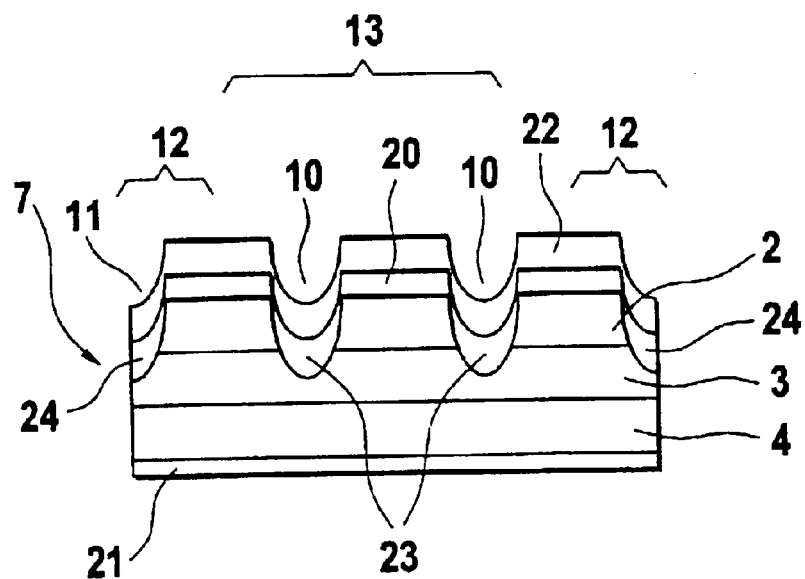
Fig. 1a shows a cross-sectional side view of a diode in accordance with the present invention.

BRIEF DESCRIPTION OF THE DRAWINGS, should read as follows:

Fig. 1a shows a cross-sectional side view of a diode in accordance with the present invention.

Figure 1B:
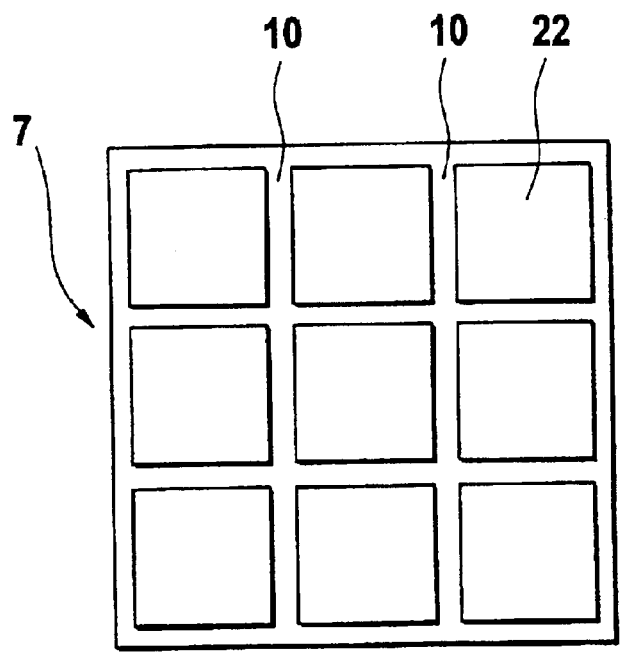

Fig. 1b shows a plan view of the diode shown in Fig. 1a.

Figure 2:
Fig. 2 shows a semiconductor wafer used as the starting material in a method for producing the semiconductor arrangement in accordance with the present invention.

Fig. 2 shows a semiconductor wafer used as the starting material in a method for producing the semiconductor arrangement in accordance with the present invention.

Figure 3:
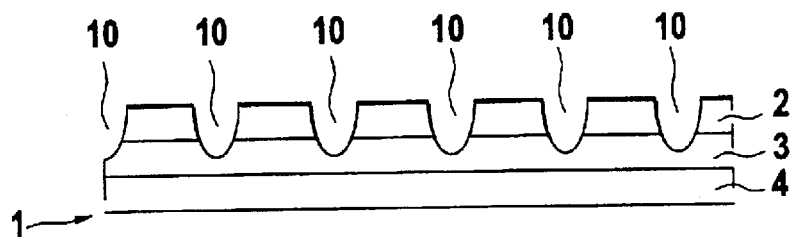
Fig. 3 shows the semiconductor wafer in a further method step for producing the semiconductor arrangement in accordance with the present invention.

Fig. 3 shows the semiconductor wafer in a further method step for producing the semiconductor arrangement in accordance with the present invention.

Figure 4:
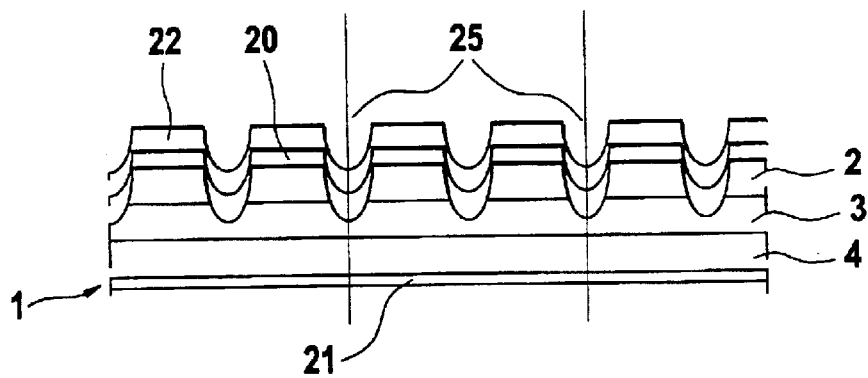
Fig. 4 shows the semiconductor wafer in yet another method step for producing the semiconductor arrangement in accordance with the present invention.--

Fig. 4 shows the semiconductor wafer in yet another method step for producing the semiconductor arrangement in accordance with the present invention.--

UNITED STATES PATENT AND TRADEMARK OFFICE
CERTIFICATE OF CORRECTION

PATENT NO.    : 6,716,714 B1
DATED         : April 6, 2004
INVENTOR(S)   : Herbert Goebel et al.

It is certified that error appears in the above-identified patent and that said Letters Patent is hereby corrected as shown below:

Column 2,
Line 43, change "neutral is filing" to -- neutral filing --

Signed and Sealed this

Fourteenth Day of June, 2005

JON W. DUDAS
*Director of the United States Patent and Trademark Office*